(12) United States Patent
Kossakovski

(10) Patent No.: US 10,727,390 B2
(45) Date of Patent: Jul. 28, 2020

(54) DISTRIBUTED THERMOELECTRICS AND CLIMATE COMPONENTS USING SAME

(71) Applicant: Gentherm Incorporated, Northville, MI (US)

(72) Inventor: Dmitri Kossakovski, South Pasadena, CA (US)

(73) Assignee: Gentherm Incorporated, Northville, MI (US)

( * ) Notice: Subject to any disclaimer, the term of this patent is extended or adjusted under 35 U.S.C. 154(b) by 0 days.

(21) Appl. No.: 16/085,417

(22) PCT Filed: Mar. 22, 2017

(86) PCT No.: PCT/US2017/023526
§ 371 (c)(1),
(2) Date: Sep. 14, 2018

(87) PCT Pub. No.: WO2017/165484
PCT Pub. Date: Sep. 28, 2017

(65) Prior Publication Data
US 2019/0081225 A1 Mar. 14, 2019

Related U.S. Application Data

(60) Provisional application No. 62/311,464, filed on Mar. 22, 2016.

(51) Int. Cl.
*H01L 35/30* (2006.01)
*H01L 35/04* (2006.01)
*B60N 2/56* (2006.01)

(52) U.S. Cl.
CPC ............ *H01L 35/30* (2013.01); *B60N 2/5642* (2013.01); *B60N 2/5692* (2013.01); *H01L 35/04* (2013.01)

(58) Field of Classification Search
CPC ....... H01L 35/30; H01L 35/04; B60N 2/5642; B60N 2/5692
See application file for complete search history.

(56) References Cited

U.S. PATENT DOCUMENTS 4,802,929 A * 2/1989 Schock .................. H01L 35/30
136/202
6,347,521 B1 * 2/2002 Kadotani ................ F25B 21/02
136/204

(Continued)

FOREIGN PATENT DOCUMENTS

DE 19503291 A1 * 8/1996 ............... A47C 7/74
DE 19503291 A1 8/1996

(Continued)

OTHER PUBLICATIONS

International Search Report and Written Opinion for International Application No. PCT/US2017/023526 dated Jun. 12, 2017.

(Continued)

*Primary Examiner* — Jayne L Mershon
(74) *Attorney, Agent, or Firm* — Carlson, Gaskey & Olds, P.C.

(57) ABSTRACT

A thermoelectric assembly includes first and second shunts spaced apart from one another in a through-plane direction. At least one of the first and second shunts having a shunt area in an in-plane direction. P-n pellets interconnect the first and second shunts electrically in series with one another in the in-plane direction. The p-n pellets have faces that engage the first and second shunts. At least one of the faces have a pellet area. The pellet area is substantially less than the shunt area.

10 Claims, 3 Drawing Sheets

(56) References Cited

U.S. PATENT DOCUMENTS

| | | | |
|---|---|---|---|
| 6,804,966 B1 * | 10/2004 | Chu | ........................ F25B 21/02 |
| | | | 257/E23.082 |
| 8,969,703 B2 | 3/2015 | Makansi et al. | |
| 2002/0074646 A1 | 6/2002 | Saika | |
| 2009/0025770 A1 * | 1/2009 | Lofy | ........................ H01L 35/32 |
| | | | 136/201 |
| 2011/0067742 A1 * | 3/2011 | Bell | ........................ F01N 3/043 |
| | | | 136/204 |
| 2012/0160290 A1 | 6/2012 | Chen et al. | |
| 2012/0305044 A1 * | 12/2012 | Zykin | ...................... F25B 21/04 |
| | | | 136/201 |
| 2013/0008181 A1 | 1/2013 | Makansi et al. | |
| 2016/0133817 A1 | 5/2016 | Makansi et al. | |
| 2016/0152167 A1 | 6/2016 | Kozlowski | |

FOREIGN PATENT DOCUMENTS

| | | | | |
|---|---|---|---|---|
| JP | 2014240269 A | | 12/2014 | |
| JP | 2016012613 | * | 1/2016 | ............. H01L 35/30 |
| JP | 2016012613 A | | 1/2016 | |
| WO | 0130606 A1 | | 5/2001 | |
| WO | 2016130840 A1 | | 8/2016 | |
| WO | 2017106829 A1 | | 6/2017 | |

OTHER PUBLICATIONS

International Preliminary Report on Patentability for PCT Application No. PCT/US2017/023530 dated Oct. 4, 2018.
International Preliminary Report on Patentability for PCT Application No. PCT/US2017/023526 dated Oct. 4, 2018.

* cited by examiner

DISTRIBUTED THERMOELECTRICS AND CLIMATE COMPONENTS USING SAME

CROSS-REFERENCE TO RELATED APPLICATIONS

This application is a United States National Phase Application of PCT Application No. PCT/US2017/023526 filed on Mar. 22, 2017, which claims priority to U.S. Provisional Application No. 62/311,464, which was filed on Mar. 22, 2016 and is incorporated herein by reference.

BACKGROUND

This disclosure relates to conductive cooling of surfaces, such as seat covers or electronics, using distributed thermoelectrics.

Heated and cooled seats are becoming more prevalent in automotive applications. One approach is to use a flexible duct mounted to a shaped foam block that forms a seat cushion or seat back. Conditioned air is blown through the duct. A fabric is supported on the flexible duct, and a perforated aesthetic cover is wrapped around the foam. Air is supplied through apertures in the flexible duct and then passed through perforations in the cover to thermally regulate the seating surface.

Another approach incorporates at least one rigid thermoelectric device (TED) arranged beneath the support surface of the foam. Air is blown across the main (e.g., cold) side of the TED to provide cooled air to the aesthetic cover. A traditional TED arrangement for seating application utilizes one or more rigid TEDs that are "off the shelf" (e.g., 25 mm×50 mm).

Covers with perforations may be undesirable. Additionally, there may be thermal losses with the above approaches.

A typical TED provides concentrated cooling for high heat flux heat sources, such as electronics. For such applications, the TED has a high packing density, for example, 50-80% TED area relative to packaging area of the assembly. The shunts are sized slightly larger than the pellets in a typical TED, for example, 110% the diameter of the pellet and 220% the length of the pellet. This configuration enables a dense packaging to maximize cooling for the TED's footprint.

SUMMARY

In one exemplary embodiment, a thermoelectric assembly includes first and second shunts spaced apart from one another in a through-plane direction. At least one of the first and second shunts having a shunt area in an in-plane direction. P-n pellets interconnect the first and second shunts electrically in series with one another in the in-plane direction. The p-n pellets have faces that engage the first and second shunts. At least one of the faces have a pellet area. The pellet area is substantially less than the shunt area.

In a further embodiment of any of the above, the pellet area is less than 25% of the shunt area.

In a further embodiment of any of the above, the pellet area is less than 10% of the shunt area.

In a further embodiment of any of the above, the pellet area is less than 5% of the shunt area.

In a further embodiment of any of the above, the first shunt is a main side shunt and the second shunt is a waste side shunt. The main and waste side shunts are separated by an insulation layer. The p-n pellets are disposed within the insulation layer.

In a further embodiment of any of the above, the main and waste side shunts are provided by flexible metallic foils and comprise an aesthetic cover arranged adjacent to the main side shunt.

In a further embodiment of any of the above, a fluid passage is arranged adjacent to the waste side shunt. A blower is in fluid communication with the fluid passage and is configured to blow a fluid through the fluid passage to provide heat flux between the fluid and the waste side shunt.

In a further embodiment of any of the above, flexible first and second dielectric layers respectively are bonded to the first and second shunts.

In a further embodiment of any of the above, a first set of p-n pellets are arranged in a first region in a first in-plane density. A second set of p-n pellets are arranged in a second region in a second in-plane density that is different than the first in-plane density.

In another exemplary embodiment, a climate control seat includes a cushion. A thermoelectric assembly includes main and waste side shunts spaced apart from one another in a through-plane direction. At least one of the main and waste side shunts have a shunt area in an in-plane direction. P-n pellets interconnect the main and waste side shunts electrically in series with one another in the in-plane direction. The p-n pellets have faces that engage the main and waste side shunts. At least one of the faces have a pellet area. The pellet area is substantially less than the shunt area. A fluid passage is supported by the cushion and arranged adjacent to the waste side shunt. A blower is in fluid communication with the fluid passage and is configured to blow a fluid through the fluid passage to provide heat flux between the fluid and the waste side shunt. An aesthetic cover is arranged over the main side shunt.

In a further embodiment of any of the above, the first shunt is a main side shunt. The second shunt is a waste side shunt. The main and waste side shunts are separated by an insulation layer. The p-n pellets are disposed within the insulation layer. The main and waste side shunts are provided by flexible metallic foils.

In a further embodiment of any of the above, flexible first and second dielectric layers respectively are bonded to the main and waste side shunts.

In a further embodiment of any of the above, the pellet area is less than 25% of the shunt area.

In a further embodiment of any of the above, the pellet area is less than 10% of the shunt area.

In a further embodiment of any of the above, the pellet area is less than 5% of the shunt area.

In a further embodiment of any of the above, a first set of p-n pellets are arranged in a first region in a first in-plane density. A second set of p-n pellets are arranged in a second region in a second in-plane density that is different than the first in-plane density.

In a further embodiment of any of the above, the aesthetic cover provides first and second occupant support surfaces. The first and second support regions are provided respectively beneath the first and second occupant support surfaces.

In another exemplary embodiment, a thermoelectric climate component includes an aesthetic cover. A thermoelectric assembly includes main and waste side shunts spaced apart from one another in a through-plane direction. The main side shunt is arranged adjacent to the aesthetic cover. At least one of the main and waste side shunts have a shunt area in an in-plane direction. P-n pellets interconnect the main and waste side shunts electrically in series with one another in the in-plane direction. The p-n pellets have faces that engage the main and waste side shunts. At least one of the faces have a pellet area. The pellet area is substantially less than the shunt area.

In a further embodiment of any of the above, the pellet area is less than 10% of the shunt area.

In a further embodiment of any of the above, the pellet area is less than 5% of the shunt area.

BRIEF DESCRIPTION OF THE DRAWINGS

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible. Like reference numbers and designations in the various drawings indicate like elements.

DETAILED DESCRIPTION

Figure 1:
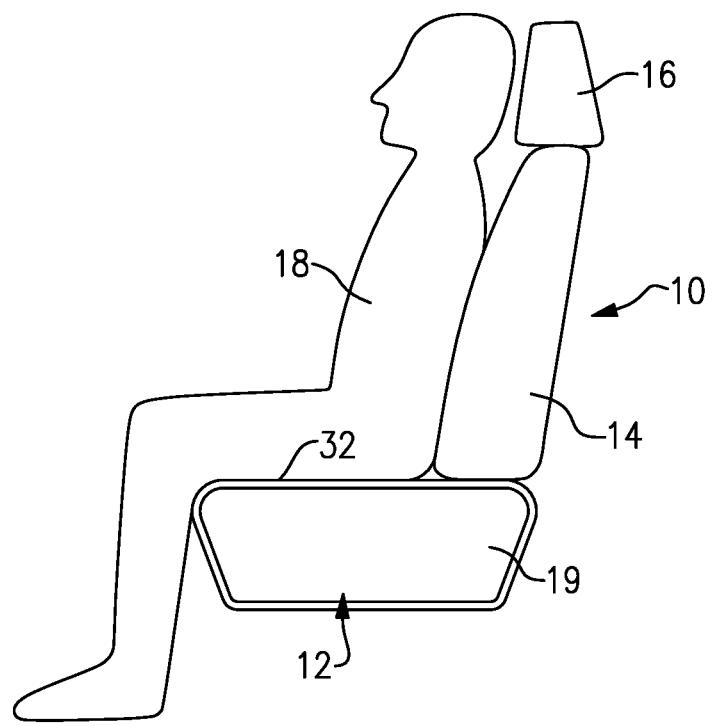
FIG. 1 is a schematic view of a seated occupant.
Figure 2:
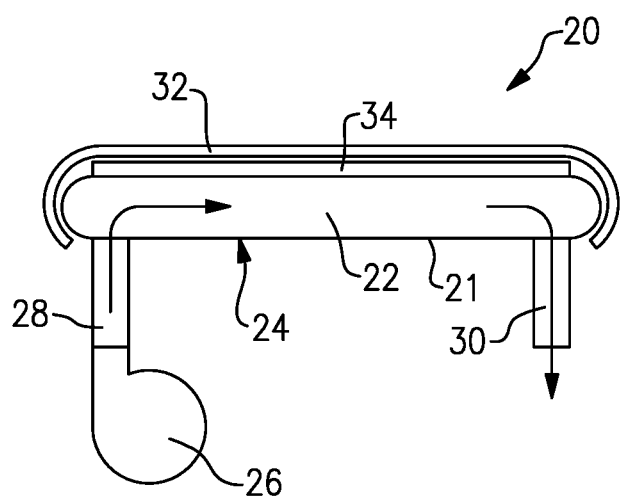
FIG. 2 is a schematic view of an example conductive thermal conditioning assembly for the seat shown in FIG. 1.

FIG. 1 illustrates an occupant 18 in a seat 10. The seat 10 includes a bottom 12 and a back 14 having a headrest 16. The seat bottom and back 12, 14 typically include a supportive foam cushion 19 wrapped in an aesthetic cover 32. Referring to FIG. 2, a thermoelectric device (TED) assembly 34 is provided between the cushion (not shown) and the aesthetic cover 32 to provide heating and/or cooling to the seated occupant. The TED assembly 34 can be used in numerous other applications, such as seat backs, door panels, consoles, chairs, beds, for example.

For applications where the cooling power density does not need to be high, a distributed architecture may be useful. Flexible TED assemblies may be useful for heating or cooling seating applications, for example, and other complex shapes. Such applications do not necessarily need a high power density, in particular, if the TED is used as a flexible layer beneath a substantial portion of the aesthetic cover. It also may be desirable to instead provide a larger footprint TED with a flexible substrate. This may be accomplished by generally maintaining the same quantity of TED pellets (p-n junctions) of a traditional, small TED but using a much larger flexible substrate that spans a large portion of an underside of the aesthetic cover (e.g., 400 mm×400 mm).

Figure 3:
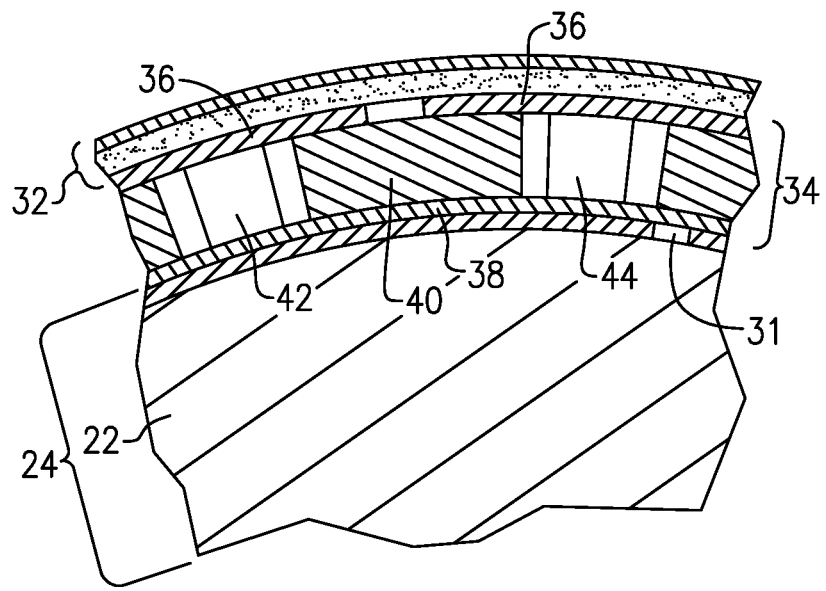
FIG. 3 is an enlarged cross-sectional view of a portion of the conductive thermal conditioning assembly of FIG. 2 with a thermoelectric device assembly.

With reference to FIG. 3, the TED assembly 34 includes main side and waste side shunts 36, 38 that provide flexible layers spaced apart from one another in a through-plane direction. A cross sectional shape of the shunts 36, 38 may vary to provide suitable coverage throughout an area of the surface of the seat 10 to be conditioned. In various examples, the shape may be polygonal as illustrated by shunt 36' (FIG. 6B) or irregular with a combination of straight and curved sides as illustrated by shunt 36" (FIG. 6B). Moreover the shunts 36, 38 may have three or more shapes as illustrated by the different shapes of shunts 36', 36" and shunt 36". In the example, the shunts are constructed from a relatively large flexible metallic foil, such as copper, which may be 10 microns thick, for example. Using a large metallic foil enables the shunts to act as in-plane heat spreaders, in addition to providing the electrical connection, unlike traditional wire connections. p-n pellets 42, 44 are arranged between and interconnected to the main side and waste side shunts 36, 38, which are electrically connected to the p-n pellets 42, 44 in series as illustrated by the dashed lines in FIGS. 6A and 6B. The pellets may have any suitable cross-section, for example, quadrangular or circular. A power supply 45 supplies power to the TED assembly 34. When power is applied to the TED assembly 34 for cooling at a first polarity, the main side becomes cold and the waste side becomes hot. In various examples, the power supply 45 may supply power at an opposite, second polarity for heating, where the main side becomes hot and the waste side becomes cold.

The p-n pellets 42, 44 are disposed within an insulation layer 40, which electrically and thermally isolates the main and waste side shunts 36, 38 and provides support between the layers. In one example, the insulation layer 40 is constructed from a silicone foam or other foam that is stable in the temperature range in which the TED operates and in the environment to which it is exposed. The insulation layer may be arranged between the waste side and the main side during assembly of the layers or injected into the space provided between the pellets after assembly of the layers.

Returning to FIG. 2, when used for cooling in a seat, the main side shunt 36 (FIG. 3) receives heat flow from an occupant supported on an aesthetic cover 32 adjoining the TED assembly 34. The waste side layer 14 rejects heat through a barrier layer 21 into air within a distribution fabric or spacer layer 22 in a bag 24 that provides a fluid passage, which receives an airflow from a blower 26 through inlet duct 28 and then expels the rejected heat through outlet duct 30. In such a construction, the barrier layer 21 forms an enclosure that defines the passage and the spacer layer 22 is configured to maintain space within the passage for the air to flow when the occupant is seated and applying pressure to the bag 24. In various features, the barrier layer 21 is thermally conductive and optionally includes apertures 31 that enable the air flowing through the bag 24 to exchange heat with the waste side shunt 38 without the heat passing through the barrier layer 21.

Figure 4:
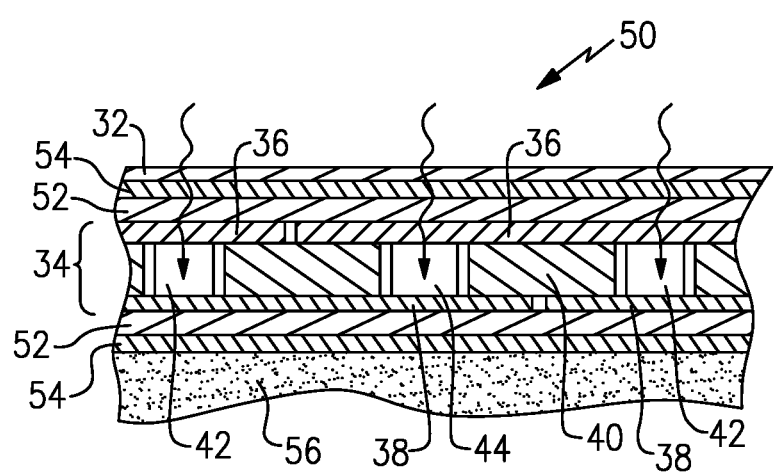
FIG. 4 is a cross-sectional view of a thermoelectric device assembly arranged in a component.

The TED assembly 34, which includes the insulation layer 40, is 1-1.5 mm thick for example. In the example shown in FIG. 4, the TED assembly 34 is supported on a substrate 56 of a component 50. A dielectric layer 52 may be provided on the main side shunt 36 and/or the waste side shunt 38 to provide strain relief during flexing of the TED assembly 34. In one example, the dielectric layers, which may be 50-70 microns thick, are provided by polyurethane (PU), polyimide (PI), polytetrafluoroethylene (PTFE), or other suitable dielectric materials. To further promote efficient spreading of cooling and heating from the main and waste side shunts 36, 38, a heat spreader 54 may be provided on the dielectric layer 52 and may be constructed from a metal foil, grafoil, graphene or other suitable thermally conductive material.

Figure 5:
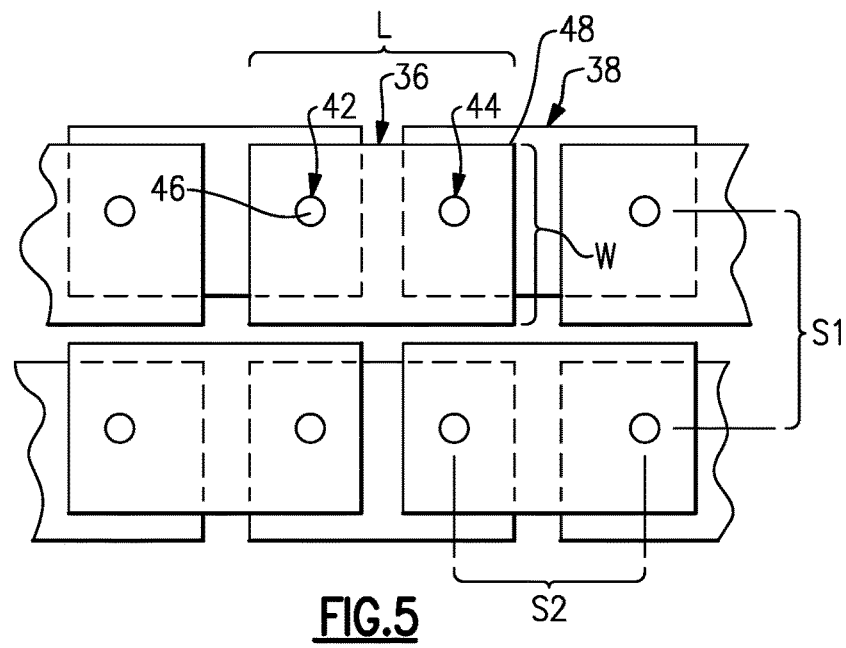
FIG. 5 is a schematic top elevational view of one embodiment of the thermoelectric device assembly shown in FIGS. 3 and 4.

An example layout of the p-n pellets 42, 44 and the main and waste side shunts 36, 38 is shown schematically in FIG. 5. In one example, the shunts have an in-plane width W and length L of 1-4 cm. In various examples, the width W may be more than 25% of and approach 50% of the spacing S1 between pellets, and the length L may be more than 25% of and approach 50% of the spacing S2 between pellets. Each shunt includes a perimeter 48 that defines a shunt area. To potentially avoid the use of a separate heat spreader layer on the main and/or waste sides adjacent the shunts, the shunt are sized such that the sum of the areas of the shunts approaches the packaging area. In various examples, the sum of the areas may be greater than 50% of the packaging area or area to be thermally conditioned.

The pellets include a face 46, which may be a few millimeters in diameter, having a pellet area and engages the shunt. A traditional TED has relatively densely packed pellets relative to the area of the shunts. By way of contrast, in a more distributed architecture, as disclosed, the pellet area is significantly less than the shunt area, for example, less than 25%. In another example the pellet area is less than 10% of the shunt area, and in another example the pellet area is less than 5% of the shunt area.

Figure 6A:
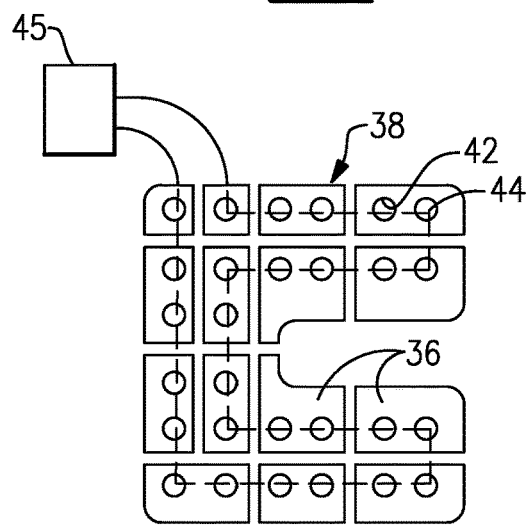
FIG. 6A a schematic view of a distributed architecture of the thermoelectric device assembly for use in a seat bottom.
Figure 6B:
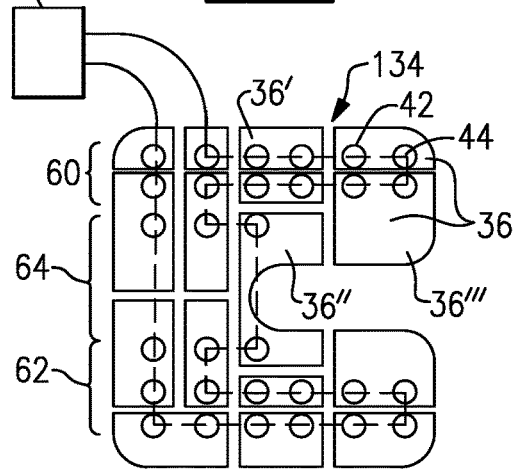
FIG. 6B is another example distributed architecture for a seat bottom.

The pellets 42, 44 may be relatively uniformly distributed throughout the TED assembly 34 if desired (FIG. 6A). Alternatively, the positioning and density of the pellets 42, 44 can be configured to provide an arrangement that accounts for or provides a varying heat flux between the occupant and the aesthetic surface 32. A first set of p-n pellets are arranged in a first region in a first in-plane density, and a second set of p-n pellets arranged in a second region in a second in-plane density that is different than the first in-plane density. For example, as shown in FIG. 6B, region 60 is denser where the occupant's legs would be positioned and becomes less dense in regions 62, 66 approaching the occupant's groin, which is more sensitive to large changes in heat flux. In other examples, the density may be less in areas where the occupant generally does not contact the aesthetic surface 32. In the examples shown in FIGS. 6A and 6B, the shunts 36 are sized such that the sum of the areas approaches the packaging area.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A flexible thermoelectric assembly comprising:
   first and second shunts spaced apart from one another in a through-plane direction, at least one of the first and second shunts having a shunt area in an in-plane direction; and
   p-n pellets interconnecting the first and second shunts electrically in series with one another in the in-plane direction, the p-n pellets having faces that engage the first and second shunts, at least one of the faces have a pellet area, wherein the pellet area is substantially less than the shunt area; and
   wherein at least one of the first and second shunts are provided by a flexible foil providing a flexible thermoelectric assembly substrate layer.

2. The flexible thermoelectric assembly according to claim 1, wherein the pellet area is less than 10% of the shunt area.

3. The flexible thermoelectric assembly according to claim 2, wherein the pellet area is less than 5% of the shunt area.

4. The flexible thermoelectric assembly according to claim 1, wherein the first and second shunts separated by an insulation layer, the p-n pellets are disposed within the insulation layer and forming the flexible thermoelectric assembly substrate layer.

5. The flexible thermoelectric assembly according to claim 1, wherein the first shunt is a main side shunt, and the second shunt is a waste side shunt, comprising a fluid passage arranged adjacent to the waste side shunt, and a blower in fluid communication with the fluid passage and configured to blow a fluid through the fluid passage to provide heat flux between the fluid and the waste side shunt.

6. The flexible thermoelectric assembly according to claim 5, comprising flexible first and second dielectric layers respectively bonded to the first and second shunts and forming the flexible thermoelectric assembly substrate layer.

7. The flexible thermoelectric assembly according to claim 1, comprising a first set of p-n pellets arranged in a first region in a first in-plane density, and a second set of p-n pellets arranged in a second region in a second in-plane density that is different than the first in-plane density.

8. The flexible thermoelectric assembly according to claim 1, wherein the at least one of the first and second shunts provided by the flexible foil comprises two or more different shapes.

9. The flexible thermoelectric assembly according to claim 1, wherein the flexible foil comprises a metallic foil.

10. The flexible thermoelectric assembly according to claim 1, comprising an aesthetic cover supported by one of the first and second dielectric layers, the aesthetic layer configured to flex with the flexible thermoelectric assembly substrate layer in response to occupant pressure.

\* \* \* \* \*